United States Patent
Oh et al.

(10) Patent No.: US 9,496,870 B2
(45) Date of Patent: Nov. 15, 2016

(54) SEMICONDUCTOR DEVICE (71) Applicant: SK hynix Inc., Icheon-si Gyeonggi-do (KR)

(72) Inventors: Ic Su Oh, Seoul (KR); Chang Kyu Choi, Seoul (KR); Dae Han Kwon, Seoul (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/697,916

(22) Filed: Apr. 28, 2015

(65) Prior Publication Data

US 2016/0218713 A1 Jul. 28, 2016

(30) Foreign Application Priority Data

Jan. 26, 2015 (KR) .................. 10-2015-0012091

(51) Int. Cl.
| | |
|---|---|
| *H03B 1/00* | (2006.01) |
| *H03K 19/00* | (2006.01) |
| *H03K 3/356* | (2006.01) |
| *H03K 19/0185* | (2006.01) |

(52) U.S. Cl.
CPC ...... *H03K 19/0013* (2013.01); *H03K 3/35613* (2013.01); *H03K 3/356104* (2013.01); *H03K 3/356165* (2013.01); *H03K 19/018521* (2013.01); *H03K 19/018571* (2013.01); *H03K 19/018585* (2013.01)

(58) Field of Classification Search
CPC ......... G11C 19/28; G09G 2310/0286; G09G 2310/0267
See application file for complete search history.

(56) References Cited

U.S. PATENT DOCUMENTS

| | | | | |
|---|---|---|---|---|
| 6,385,274 | B1 * | 5/2002 | Nohara ............... | G06F 11/0757 377/16 |
| 7,468,615 | B1 * | 12/2008 | Tan .................. | H03K 19/00315 326/68 |
| 2008/0211548 | A1 | 9/2008 | Hayashi et al. | |
| 2011/0199128 | A1 * | 8/2011 | Turner .................. | G06F 1/0328 327/106 |
| 2012/0169383 | A1 * | 7/2012 | Kakamu .......... | H03K 3/356113 327/117 |
| 2015/0180475 | A1 * | 6/2015 | Priel ................ | H03K 19/00384 327/108 |

FOREIGN PATENT DOCUMENTS

KR 20100040423 A 4/2010

* cited by examiner

*Primary Examiner* — Sibin Chen
(74) *Attorney, Agent, or Firm* — William Park & Associates Ltd.

(57) ABSTRACT

A semiconductor device is disclosed, which relates to a technology for reducing current consumption of a semiconductor chip configured to operate a transmitter (Tx) at a high speed. The semiconductor device includes a data driving unit configured to output a pull-up drive signal and a pull-down drive signal by level-shifting an input signal according to a clock signal; and a data output unit configured to adjust slew rates of the pull-up drive signal and the pull-down drive signal according to a code signal, and output impedance-adjusted signals to an output terminal.

19 Claims, 3 Drawing Sheets

SEMICONDUCTOR DEVICE

CROSS-REFERENCE TO RELATED APPLICATION

This application claims priority based upon Korean patent application No. 10-2015-0012091, filed on Jan. 26, 2015, the disclosure of which is hereby incorporated in its entirety by reference herein.

BACKGROUND OF THE INVENTION

Embodiments of the invention relate to a semiconductor device, and more particularly to a technology for reducing current consumption of a semiconductor chip configured to operate a transmitter (Tx) at a high speed.

With increasing integration of semiconductor memory devices, semiconductor memory devices have also been continuously improved to increase operation speed thereof. In order to increase operation speeds of semiconductor memory devices, synchronous memory devices capable of operating by synchronizing with an external clock of a memory chip have recently been proposed and developed.

The semiconductor memory device or the like communicates with a controller using a data bus. In this case, transmission/reception data may be distorted in response to a used bus frequency. Specifically, the faster the operation frequency, the higher the probability of data distortion.

Generally, in order to prevent such signal distortion, termination processing is performed using elements such as a termination resistor of a receiver or transmitter of the semiconductor memory device. That is, the termination resistor effectively absorbs reflection of signals so as to improve signal distortion.

The operation for processing a signal line as a termination resistor (RU) will hereinafter be referred to as On Die Termination (ODT).

BRIEF SUMMARY

In accordance with an embodiment of the invention, a semiconductor device includes a data driving unit configured to output a pull-up drive signal and a pull-down drive signal by level-shifting an input signal according to a clock signal. The semiconductor device also includes a data output unit configured to adjust slew rates of the pull-up drive signal and the pull-down drive signal according to a code signal and output impedance-adjusted signals to an output terminal.

In an embodiment, a semiconductor device includes a data driving unit configured to output a pull-up drive signal and a pull-down drive signal by driving data. The semiconductor device also includes a data output unit configured to perform a termination of at a position of a signal line termination according to the pull-up drive signal and the pull-down drive signal and output a termination result to an output terminal.

In an embodiment, a semiconductor device includes a data driving unit including a plurality of drivers configured to drive data according to clock signals and output a pull-up drive signal and a pull-down drive signal. The semiconductor device also includes a data output unit configured to output a drive signal by inverting the pull-up drive signal and the pull-down drive signal.

In an embodiment, a precharge unit is configured to precharge the output node with the power-supply voltage level when the pulse control signal is activated.

In an embodiment, a pulse generator performs a logic AND operation between the output signal and an inversion signal of the output signal to output the pulse control signal.

In an embodiment, a drive signal generator includes: a first drive signal generator configured to generate the pull-up drive signal according to the output signal; and a second drive signal generator configured to generate the pull-down drive signal according to the output signal.

In an embodiment, a drive signal input unit includes: a plurality of inverters configured to perform non-inversion delaying of the pull-up drive signal and the pull-down drive signal.

In an embodiment, a plurality of pre-drivers are divided on the basis of a specific unit according to the output signal of the adjusting unit, and then activated.

DETAILED DESCRIPTION

Reference will now be made in detail to embodiments of the invention, examples of which are illustrated in the accompanying figures. Wherever possible, the same reference numbers are used throughout the figures to refer to the same or like portions. In the following description of the invention, a detailed description of related known configurations or functions incorporated herein may be omitted for clarity of the subject matter of the invention. Various embodiments of the invention are directed to providing a semiconductor device that substantially obviates one or more problems due to limitations and disadvantages of related art. The embodiments of the invention may relate to a technology for implementing a high-speed operation by improving a transmitter (Tx) of the semiconductor device.

A main memory may use an internal voltage at a data path (peripheral circuit), separately from an external voltage to reduce power consumption. In this case, level-shifted data needs to be applied to the transmitter (Tx).

However, the level-shifting operation from a low voltage to a high voltage has difficulty in satisfying not only a wide voltage gap situation in which a difference in voltage between a low voltage and a high voltage is a specific voltage (e.g., 0.5V) or higher, but also a high speed data rate.

Further, the operation for controlling a slew rate of an output signal through a conventional RC ladder structure has a limitation in processing high-speed data. Therefore, an embodiment of the invention improves the structures of the level shifter and the RC ladder, and can process high-speed data without being affected by PVT (Process, Voltage, Temperature).

Figure 1:
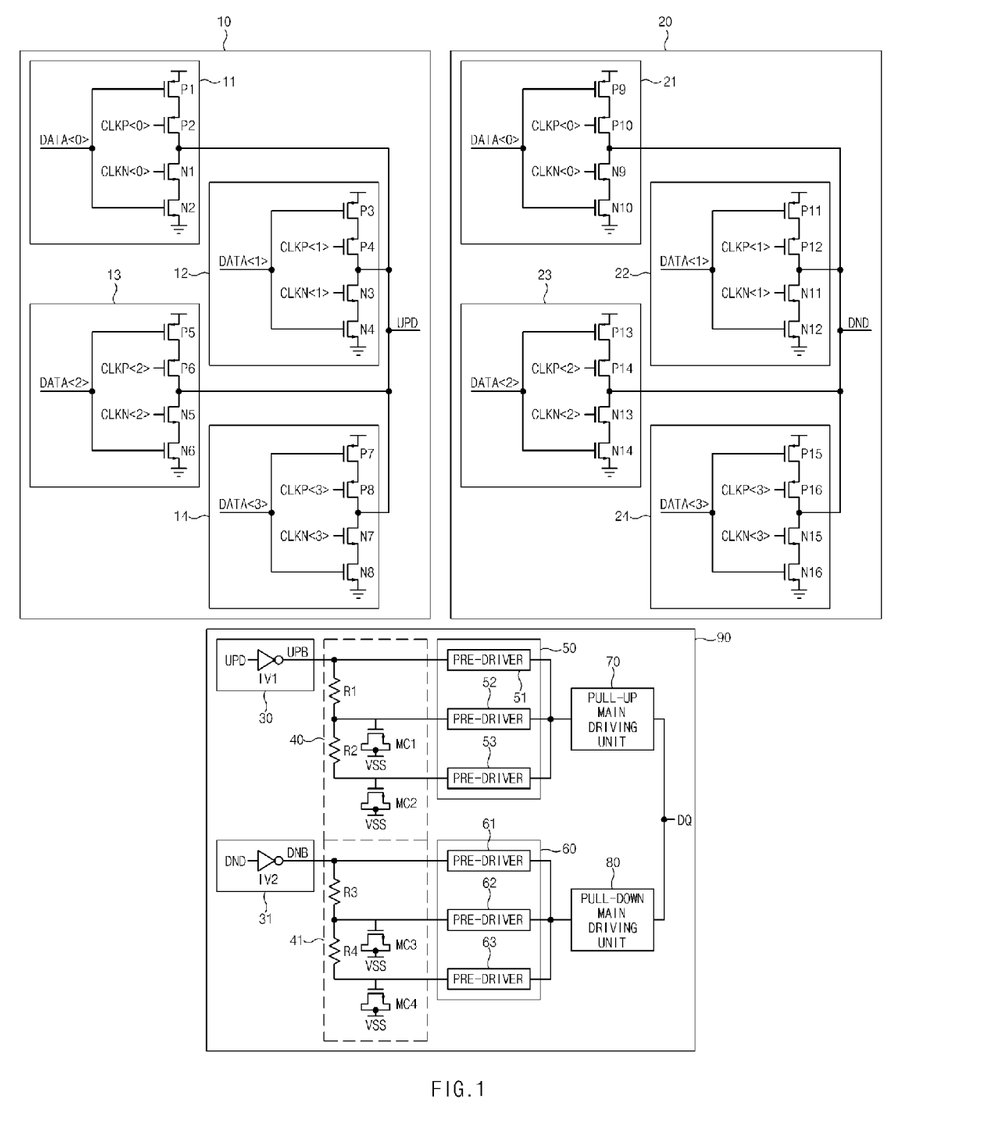
FIG. 1 is a schematic diagram illustrating a semiconductor device according to an embodiment of the invention.

Referring to FIG. 1, a schematic diagram illustrating a semiconductor device according to an embodiment of the invention is illustrated.

In FIG. 1, the semiconductor device includes data driving units (10, 20) and a data output unit 90.

The data driving unit 10 outputs a pull-up drive signal UPD by driving data. The data driving unit 10 outputs a pull-down drive signal DND by driving data.

The data driving unit 10 includes a plurality of drivers (11~14). The driver 11 may drive data DATA<0> in response to clock signals (CLKP<0>, CLKN<0>) and output a pull-up drive signal UPD.

The driver 11 may include PMOS transistors (P1, P2) and NMOS transistors (N1, N2) which are electrically coupled in series between a power-supply voltage terminal and a ground voltage terminal. The PMOS transistor P1 and the NMOS transistor N2 may receive data DATA<0> through a common gate terminal. The PMOS transistor P2 may receive the clock signal CLKP<0> through a gate terminal. The NMOS transistor N2 may receive the clock signal CLKN<0> through a gate terminal.

The driver 12 may output a pull-up drive signal UPD by driving data DATA<1> according to the clock signals (CLKP<1>, CLKN<1>). The driver 12 may include PMOS transistors (P3, P4) and NMOS transistors (N3, N4), which are electrically coupled in series between a power-supply voltage terminal and a ground voltage terminal. The PMOS transistor P3 and the NMOS transistor N4 may receive data DATA<1> through a common gate terminal. The PMOS transistor P4 may receive the clock signal CLKP<1> through a gate terminal. The NMOS transistor N3 may receive the clock signal CLKN<1> through a gate terminal.

The driver 13 may output a pull-up drive signal UPD by driving data DATA<2> according to clock signals (CLKP<2>, CLKN<2>). The driver 13 may include PMOS transistors (P5, P6) and NMOS transistors (N5, N6), which are electrically coupled in series between a power-supply voltage terminal and a ground voltage terminal. The PMOS transistor P5 and the NMOS transistor N6 may receive data DATA<2> through a common gate terminal. The PMOS transistor P6 may receive the clock signal CLKP<2> through a gate terminal. The NMOS transistor N5 may receive the clock signal CLKN<2> through a gate terminal.

The driver 14 may output a pull-up drive signal UPD by driving data DATA<3> according to clock signals (CLKP<3>, CLKN<3>). The driver 14 may include PMOS transistors (P7, P8) and NMOS transistors (N7, N8), which are electrically coupled in series between a power-supply voltage terminal and a ground voltage terminal. The PMOS transistor P7 and the NMOS transistor N8 may receive data DATA<3> through a common gate terminal. The PMOS transistor P8 may receive the clock signal CLKP<3> through a gate terminal. The NMOS transistor N7 may receive the clock signal CLKN<3> through a gate terminal.

In addition, the data driving unit 20 may include a plurality of drivers (21~24). The driver 21 may drive data DATA<0> in response to clock signals (CLKP<0>, CLKN<0>). The driver 21 may output a pull-down drive signal DND.

The driver 21 may include PMOS transistors (P9, P10) and NMOS transistors (N9, N10) electrically coupled in series between a power-supply voltage terminal and a ground voltage terminal. The PMOS transistor P9 and the NMOS transistor N10 may receive data DATA<0> through a common gate terminal. The PMOS transistor P10 may receive the clock signal CLKP<0> through a gate terminal. The NMOS transistor N9 may receive the clock signal CLKN<0> through a gate terminal.

The driver 12 may output a pull-down drive signal DND by driving data DATA<1> according to clock signals (CLKP<1>, CLKN<1>). The driver 22 may include PMOS transistors (P11, P12) and NMOS transistors (N11, N12) electrically coupled in series between a power-supply voltage terminal and a ground voltage terminal. The PMOS transistor P11 and the NMOS transistor N12 may receive data DATA<1> through a common gate terminal. The PMOS transistor P12 may receive the clock signal CLKP<1> through a gate terminal. The NMOS transistor N11 may receive the clock signal CLKN<1> through a gate terminal.

The driver 23 may output a pull-down drive signal DND by driving data DATA<2> according to clock signals (CLKP<2>, CLKN<2>). The driver 23 may include PMOS transistors (P13, P14) and NMOS transistors (N13, N14) electrically coupled in series between a power-supply voltage terminal and a ground voltage terminal. The PMOS transistor P13 and the NMOS transistor N14 may receive data DATA<2> through a common gate terminal. The PMOS transistor P14 may receive the clock signal CLKP<2> through a gate terminal. The NMOS transistor N13 may receive the clock signal CLKN<2> through a gate terminal.

The driver 24 may output a pull-down drive signal DND by driving data DATA<3> according to clock signals (CLKP<3>, CLKN<3>). The driver 24 may include PMOS transistors (P15, P16) and NMOS transistors (N15, N16) electrically coupled in series between a power-supply voltage terminal and a ground voltage terminal. The PMOS transistor P15 and the NMOS transistor N16 may receive data DATA<3> through a common gate terminal. The PMOS transistor P16 may receive the clock signal CLKP<3> through a gate terminal. The NMOS transistor N15 may receive the clock signal CLKN<3> through a gate terminal.

In addition, the data output unit 90 may include drive signal input units (30, 31), adjusting units (40, 41), output driving units (50, 60), a pull-up main driving unit 70, and a pull-down main driving unit 80.

The data output unit 90 may perform termination at the position of a signal line termination according to the pull-up drive signal UPD and the pull-down drive signal DND. The data output unit 90 may thus output the termination result to an output terminal DQ.

For this purpose, the drive signal input unit 30 may include an inverter IV1 which outputs a drive signal UPB by inverting the pull-up drive signal UPD. The drive signal input unit 31 may include an inverter IV2 which outputs a drive signal DNB by inverting the pull-down drive signal DND.

The adjusting units (40, 41) may adjust slew rates of drive signals (UPB, DNB) and output the adjusted signals. The adjusting unit 40 includes resistors (R1, R2) and MOS capacitors (MC1, MC2). In this case, the resistor R1 is electrically coupled between an input terminal of the drive signal (UPB) and a pre-driver 52. The resistor R2 is electrically coupled between the resistor R1 and a pre-driver 53. In addition, the MOS capacitor MC1 is electrically coupled between a ground voltage terminal and one terminal of each resistor (R1, R2). The MOS capacitor MC2 is electrically coupled between one terminal of the resistor R2 and the ground voltage terminal VSS.

The adjusting unit 41 includes resistors (R3, R4) and MOS capacitors (MC3, MC4). The resistor R3 is electrically coupled between an input terminal of the drive signal DNB and a pre-driver 62. The resistor R4 is electrically coupled between the resistor R3 and a pre-driver 63. In addition, the MOS capacitor MC3 is electrically coupled between the ground voltage terminal and one end of each resistor (R3, R4). In this case, the MOS capacitor MC4 is electrically coupled between the ground voltage terminal and one end of the resistor R4.

The output driving units (50, 60) perform pre-driving of the output signals of the adjusting units (40, 41), and thus the pre-driving result to the pull-up main driving unit 70 and the pull-down main driving unit 80. The output driving unit 50 may include a plurality of pre-drivers (51~53) configured to pre-drive the output signal of the adjusting unit 40. The output driving unit 60 includes a plurality of pre-drivers (61~63) configured to pre-drive the output signal of the adjusting unit 41.

The output driving units (50, 60) may divide the output signals on the basis of a specific unit, and also output the divided signals. In particular, the output driving units (50, 60) may perform sizing of the output signals of the adjusting units (40, 41) on the basis of units of individual pre-drivers (51~53, 61~63), and then perform driving of the output signals.

The pull-up main driving unit 70 may pull up the output signal of the output driving unit 50 so that data of the termination-adjusted pull-up terminal is output to the output terminal DQ. The pull-down main driving unit 80 may pull down the output signal of the output driving unit 60 so that data of the termination-adjusted pull-down terminal is output to the output terminal DQ.

Figure 2:
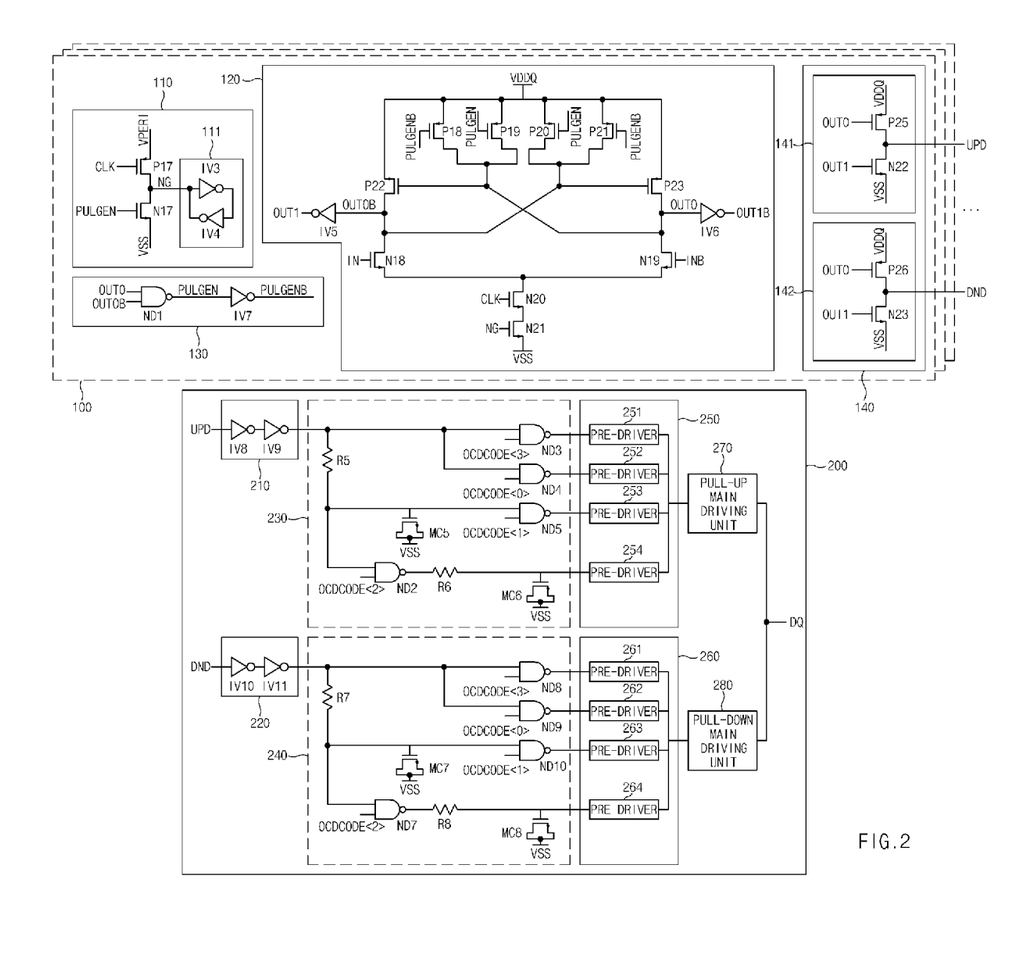
FIG. 2 is a schematic diagram illustrating a semiconductor device according to an embodiment of the invention.

Referring to FIG. 2, a schematic diagram illustrating a semiconductor device according to an embodiment of the invention is illustrated.

In FIG. 2, the semiconductor device according to an embodiment includes a data driving unit 100 and a data output unit 200.

The data driving unit 100 performs triggering and level-shifting of input signals (IN, INB) according to a clock signal CLK. The data driving unit 100 thus outputs a pull-up drive signal UPD and a pull-down drive signal DND. The input signal INB is an inversion signal of the input signal IN.

In this case, a plurality of data driving units 100 may be present on a page basis. Several data driving units 100 may output the pull-up drive signal UPD through one pull-up terminal. The several data driving units 100 may output the pull-down drive signal DND through one pull-down terminal.

For example, the semiconductor device according to an embodiment can output one pull-up drive signal UPD and one pull-down drive signal DND through four data driving units 100. Although the semiconductor device according to an embodiment includes 4 data driving units 100 for convenience of description and better understanding of the invention, the scope or spirit of the invention is not limited thereto. Further, the number of data driving units 100 may be changed as necessary.

The semiconductor device according to an embodiment may serialize data based on several phase clocks (e.g., 4 phase clocks) received from several data driving units 100. Each data driving unit 100 may perform level-shifting of the input signals (IN, INB) according to the clock signal CLK, and may output one pull-up drive signal UPD and one pull-down drive signal DND.

The data output unit 200 receives the pull-up drive signal UPD and one pull-down drive signal DND, and controls a slew rate in response to a high-speed operation. According to this semiconductor device, the data output unit 200 controls delaying caused by the resistor R and the capacitor C so that the semiconductor device can control the slew rate to implement full swing of the input signal.

For this purpose, the data driving unit 100 includes an input unit 100, a level shifter 120, a pulse generator 130, and a drive signal generator 140.

The input unit 110 may drive and latch a control signal NG according to the clock signal CLK and a pulse control signal PULGEN. The input unit 110 includes a PMOS transistor P17 serving as a pull-up drive element, an NMOS transistor N17 serving as a pull-down drive element, and a latch unit 111.

The PMOS transistor P17 and the NMOS transistor N17 are electrically coupled in series between a peri-voltage (VPERI) input terminal and a ground voltage (VSS) input terminal. The PMOS transistor P17 may receive the clock signal CLK through a gate terminal. Further, the NMOS transistor N17 may receive a pulse control signal PULGEN through a gate terminal.

If the clock signal (CLK) of the input unit 110 is at a low level, the PMOS transistor P17 is turned on so that the control signal NG is precharged with the peri-voltage (VPERI) level. If a high-level pulse control signal PULGEN is applied to the input unit 110, the NMOS transistor N17 is turned on so that the control signal NG is output at a ground voltage (VSS) level.

The latch unit 111 may include inverters (IV3, IV4) interconnected by a latch structure. The latch unit 111 may latch the control signal NG for a predetermined time. The latch unit 111 may also output the latched result to the level shifter 120.

In addition, the level shifter 120 performs level-shifting from a low voltage to a high voltage, and thus outputs the level-shifted pull-up drive signal UPD and the level-shifted pull-down drive signal DND. If a high-level clock signal CLK and a high-level control signal NG are applied to the level shifter 120, the level shifter 120 is activated.

The level shifter 120 performs level-shifting of the input signals (IN, INB) to a power-supply voltage (VDDQ) level, and outputs the output signals (OUT1, OUT1B). In addition, the level shifter 120 may precharge an output node using the pulse control signals (PULGEN, PULGENB).

For this purpose, the level shifter 120 may include PMOS transistors (P22, P23) serving as a pull-up unit, NMOS transistors (N18, N19) serving as a pull-down unit, NMOS transistors (N20, N21) serving as an activation unit, inverters (IV5, IV6) serving as an output unit, and a plurality of PMOS transistors (P18~P21) serving as a precharge unit. The NMOS transistors (N20, N21) may be configured to provide a ground voltage VSS to the pull-down unit in response to the clock signal CLK and the pulse control signal (PULGEN, PULGENB). The PMOS transistors (P18~P21) may be controlled by the pulse control signal (PULGEN, PULGENB) to be precharge the output node. Further, the output terminal of the precharge unit is electrically coupled to a gate terminal of the pull-up unit. The precharge unit is configured to precharge the output node with the power-supply voltage level when the pulse control signal (PULGEN, PULGENB) is activated.

The PMOS transistors (P18~P21) may be electrically coupled in parallel between a power-supply voltage (VDDQ) input terminal and output terminals of the output signals (OUT0, OUT0B). The PMOS transistors (P18, P19) may be electrically coupled in parallel between the power-supply voltage (VDDQ) input terminal and the output terminal of the output signal OUT0. The PMOS transistors (P20, P21) may be electrically coupled in parallel between the power-supply voltage (VDDQ) input terminal and the output terminal of the output signal OUT0B.

The PMOS transistors (P18, P21) may receive the pulse control signal PULGENB through gate terminals. The PMOS transistors (P19, P20) may receive the pulse control signal PULGEN through gate terminals.

The PMOS transistor P22 is electrically coupled between the power-supply voltage (VDDQ) input terminal and the output signal OUT0B. The PMOS transistor P23 is electrically coupled between the power-supply voltage (VDDQ) input terminal and the output terminal of the output signal OUT0. The PMOS transistor P22 may receive the output signal OUT0 through a gate terminal. The PMOS transistor P23 may receive the output signal OUT0B through a gate terminal.

The inverter IV5 may output the output signal OUT1 by inverting the output signal OUT0B. The inverter IV6 may output the output signal OUT1B by inverting the output signal OUT0.

The NMOS transistor N18 is electrically coupled between the output terminal of the output signal OUT0B and the NMOS transistor N20 so that the NMOS transistor N18 receives the input signal IN through a gate terminal. The NMOS transistor N19 is electrically coupled between the output terminal of the output signal OUT0 and the NMOS transistor N20 so that the NMOS transistor N19 receives the input signal INB through a gate terminal.

The NMOS transistors (N20, N21) are electrically coupled in series between a common source terminal of the NMOS transistors (N18, N19) and the ground voltage (VSS) input terminal. The NMOS transistor N20 may receive the clock signal CLK through a gate terminal. Further, the NMOS transistor N21 may receive the control signal NG through a gate terminal.

If the clock signal CLK and the control signal NG are at a high level, the level shifter 120 is activated. If the input signal IN is at a high level, the NMOS transistor N18 of the level shifter 120 is turned on. As a result, the output signal OUT1 is at a high level. Since the PMOS transistor P23 is turned on, the output signal OUT0 is at a high level and the output signal OUT1B is at a low level.

On the other hand, if the input signal IN is at a low level, the NMOS transistor N19 of the level shifter 120 is turned on. As a result, the output signal OUT0 is at a low level. Since the PMOS transistor P22 is turned on, the output signal OUT0B is at a high level and the output signal OUT1 is at a low level.

Further, the level shifter 120 may precharge the output signals (OUT0, OUT0B) with the power-supply voltage (VDDQ) level by the pulse control signals (PULGEN, PULGENB).

The pulse generator 130 may combine the output signals (OUT0, OUT0B). The pulse generator 130 may also output the pulse control signals (PULGEN, PULGENB). The pulse generator 130 may perform a logic AND operation between the output signals (OUT0, OUT0B), and output the pulse control signal PULGENB. More specifically, if the output signals (OUT0, OUT0B) are activated to a high level, the pulse generator 130 outputs the pulse control signal PULGENB at a high level.

For this purpose, the pulse generator 130 includes a NAND gate ND1 and an inverter IV7. The NAND gate ND1 may perform a logic NAND operation between the output signals (OUT0, OUT0B), and output the pulse control signal PULGEN. The inverter IV7 may output the pulse control signal PULGENB by inverting the pulse control signal PULGEN.

If the output signals (OUT0, OUT0B) of the level shifter 120 are at a high level, the PMOS transistors (P19, P20) are turned on by the pulse control signal PULGEN. Therefore, the output signals (OUT0, OUT0B) are precharged with the power-supply voltage (VDDQ) level.

On the other hand, if the output signals (OUT0, OUT0B) of the level shifter 120 are at a low level, the PMOS transistors (P18, P21) are turned on by the pulse control signal PULGENB. Therefore, the output signals (OUT0, OUT0B) are precharged with the power-supply voltage (VDDQ) level.

In addition, if the output signals (OUT0, OUT0B) are at a low level or if any one of the two output signals (OUT0, OUT0B) is at a low level, the PMOS transistors (P18, P21) of the level shifter 120 are turned on by the pulse control signal PULGENB. Therefore, the output signals (OUT0, OUT0B) are precharged with the power-supply voltage (VDDQ) level.

The drive signal generator 140 may pull up or down the pull-up drive signal UPD and the pull-down drive signal DND according to the output signals (OUT0, OUT1). The drive signal generator 140 may include a first drive signal generator 141 for generating the pull-up drive signal UPD and a second drive signal generator 142 for generating the pull-down drive signal DND.

The first drive signal generator 141 may output the pull-up drive signal UPD according to the output signals (OUT0, OUT1). The first drive signal generator 141 may include a PMOS transistor P25 and an NMOS transistor N22 electrically coupled in series between the power-supply voltage (VDDQ) input terminal and the ground voltage (VSS) input terminal. The PMOS transistor P25 may receive the output signal OUT0 through a gate terminal. The NMOS transistor N22 may receive the output signal OUT1 through a gate terminal.

For example, if the output signals (OUT0, OUT1) are at a high level, the NMOS transistor N22 is turned on so that the pull-up drive signal UPD is output at the ground voltage (VSS) level. On the other hand, if the output signals (OUT0, OUT1) are at a low level, the PMOS transistor P25 is turned on so that the pull-up drive signal UPD is output at the power-supply voltage (VDDQ) level.

The second drive signal generator 142 may output the pull-down drive signal DND according to the output signals (OUT0, OUT1). The second drive signal generator 142 may include a PMOS transistor P26 and an NMOS transistor N23 electrically coupled in series between the power-supply voltage (VDDQ) input terminal and the ground voltage (VSS) input terminal. The PMOS transistor P26 may receive the output signal OUT0 through a gate terminal. The NMOS transistor N23 may receive the output signal OUT1 through a gate terminal.

For example, if the output signals (OUT0, OUT1) are at a high level, the NMOS transistor N23 is turned on so that the pull-down drive signal DND is output at the ground voltage (VSS) level. On the other hand, if the output signals (OUT0, OUT1) are at a low level, the PMOS transistor P26 is turned on so that the pull-down drive signal DND is output at the power-supply voltage (VDDQ) level.

The data output unit 200 may also include the drive signal input units (210, 220), the adjusting units (230, 240), the output driving units (250, 260), the pull-up main driving unit 270, and the pull-down main driving unit 280.

The data output unit 200 may perform termination at the position of a signal line termination in response to the pull-up drive signal UPD and the pull-down drive signal DND, and output the termination result to an output terminal DQ.

For this purpose, the drive signal input unit 210 may include inverters (IV8, IV9) which perform non-inversion delaying of the pull-up drive signal UPD. The drive signal input unit 220 may include inverters (IV10, IV11) which perform non-inversion delaying of the pull-down drive signal DND.

The adjusting units (230, 240) may perform RC (Resistor, Capacitor) delaying of the signals received from the drive signal input units (210, 22) to adjust the slew rate. The adjusting unit 230 may include resistors (R5, R6), MOS capacitors (MC5, MC6), and a plurality of NAND gates (ND2~ND5).

In this case, the resistor R5 is electrically coupled between the output terminal of the drive signal input unit 210 and the NAND gate ND5. The resistor R6 is electrically coupled between the output terminal of the NAND gate ND2 and the pre-driver 254. In addition, the MOS capacitor MC5 is electrically coupled between one terminal of the resistor R5 and the ground voltage terminal. The MOS capacitor MC6 is electrically coupled between one terminal of the resistor R6 and the ground voltage terminal.

The NAND gate ND2 may perform a NAND operation between the output signal of the resistor R5 and the code signal OCDCODE<2>. The NAND gate ND3 may perform a NAND operation between the output signal of the inverter IV9 and the code signal OCDCODE<3>. The NAND gate ND4 may perform a NAND operation between the output signal of the inverter IV9 and the code signal OCDCODE<0>. The NAND gate ND5 may perform a NAND operation between the output signal of the resistor R5 and the code signal OCDCODE<1>.

The adjusting unit 240 may include resistors (R7, R8), MOS capacitors (MC7, MC8) and a plurality of NAND gates (ND7~ND10).

The resistor R7 may be electrically coupled between the output terminal of the drive signal input unit 220 and the NAND gate ND10. The resistor R8 may be electrically coupled between the output terminal of the NAND gate ND7 and the pre-driver 264. In addition, the MOS capacitor MC7 may be electrically coupled between one terminal of the resistor R7 and the ground voltage terminal. The MOS capacitor MC8 may be electrically coupled between one terminal of the resistor R8 and the ground voltage terminal.

The NAND gate ND7 may perform a NAND operation between the output signal of the resistor R7 and the code signal OCDCODE<2>. The NAND gate ND8 may perform a NAND operation between the output signal of the inverter IV11 and the code signal OCDCODE<3>. The NAND gate ND9 may perform a NAND operation between the output signal of the inverter IV11 and the code signal OCDCODE<0>. The NAND gate ND10 may perform a NAND operation between the output signal of the resistor R7 and the code signal OCDCODE<1>.

To implement a higher transfer rate of data in DDR memory devices, various new concepts have been proposed and added to the DDR memory devices. A synchronous memory device may have an Off Chip Drive (OCD) calibration control concept capable of adjusting impedance of the output unit configured to output data.

The OCD calibration adjustment control may measure a voltage or current flowing in the output driver of a memory device configured to interface data using an external device such as a chipset so that impedance of the output driver can be adjusted optimally for a present system.

During the DRAM read operation, the code signal OCDCODE<0:3> for setting drive strength of the driver may be applied to the data output unit 200 according to conditions defined in the system. The adjusting units (230, 240) may adjust impedance of the pull-up drive signal UPD and the pull-down drive signal DND according to the code signal OCDCODE<0:3>. The adjusting units (230, 240) may set the drive strength of the output driving units (250, 260) by adjusting resistance values of the drive signal input units (210, 220) according to the code signal OCDCODE<0:3>.

The output driving units (250, 260) may perform pre-driving of the output signals of the adjusting units (230, 240), and output the pre-driving result to the pull-up main driving unit 270 and the pull-down main driving unit 280. The output driving unit 250 may include a plurality of pre-drivers (251~254), each of which performs pre-driving of the output signal of the adjusting unit 230 and outputs the pre-driving result to the pull-up terminal. The output driving unit 260 may include a plurality of pre-drivers (261~264), each of which performs pre-driving of the output signal of the adjusting unit 240 and outputs the pre-driving result to the pull-down terminal.

The output driving units (250, 260) may divide the output signals of the adjusting units (230, 240) on the basis of a specific unit, and output the divided signals. The output driving units (250, 260) may be driven in units of individual pre-drivers (251~254, 261~264) according to the setting value.

The pull-up main driving unit 270 and the pull-down main driving unit 280 may adjust the output impedance of the output driving units (250, 260) and output the adjusted result to the output terminal DQ. The pull-up main driving unit 270 may pull up the output signal of the output driving unit 250 so that data of the termination-adjusted pull-up terminal is output to the output terminal DQ. The pull-down main driving unit 280 may pull down the output signal of the output driving unit 260 so that data of the termination-adjusted pull-down terminal is output to the output terminal DQ.

As is apparent from the above description, the semiconductor device according to various embodiments has the following effects.

First, according to the semiconductor device of the invention, the transmitter (Tx) of the semiconductor device is improved in structure so that the semiconductor device can process high-speed data without receiving the influence of PVT (Process, Voltage, Temperature).

Second, according to the semiconductor device of the invention, an internal voltage of the semiconductor device is shifted in level and input signals are serialized, so that unnecessary power consumption can be reduced.

Figure 3:
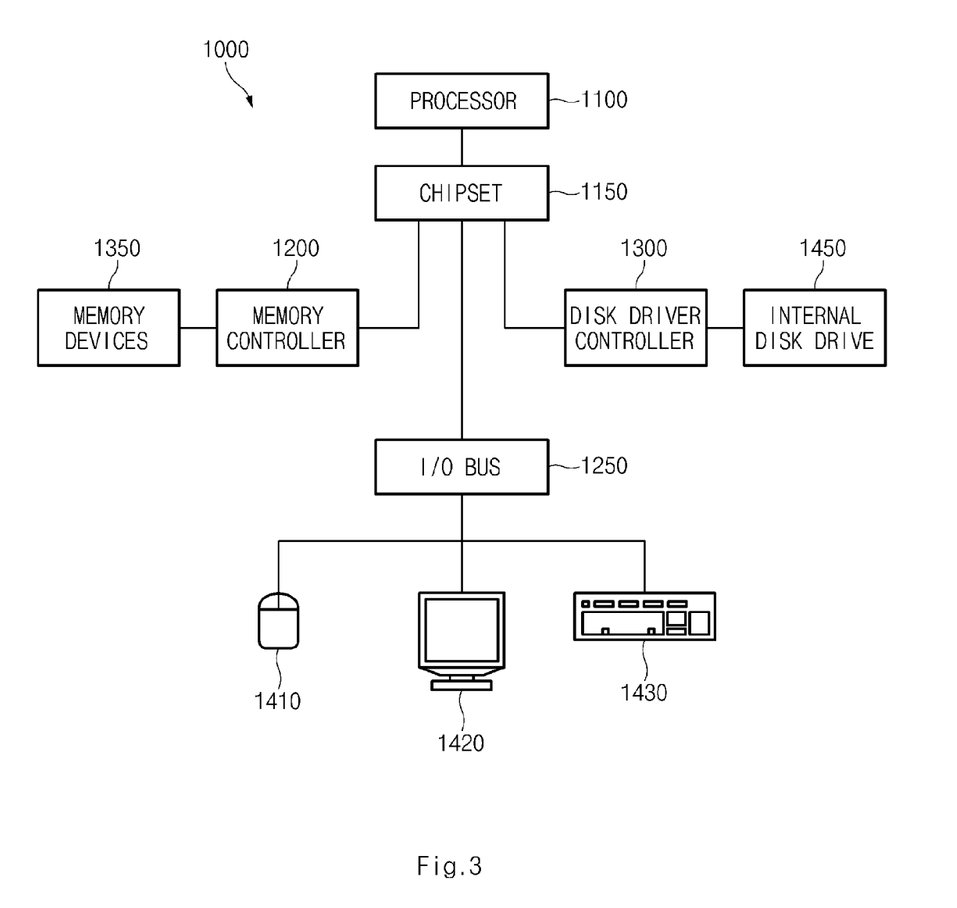
FIG. 3 illustrates a block diagram of a system employing a memory controller circuit in accordance with an embodiment of the invention.

Referring to FIG. 3, a system 1000 may include one or more processors 1100. The processor 110 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

Those skilled in the art will appreciate that the invention may be carried out in other specific ways than those set forth above without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the figures and the accompanying claims. In addition to variations and modifications in the component parts and/or arrangements, alternative uses will also be apparent to those skilled in the art.

What is claimed is:

1. A semiconductor device comprising:
   a data driving unit configured to output a pull-up drive signal and a pull-down drive signal by level-shifting an input signal according to a clock signal; and
   a data output unit configured to adjust slew rates of the pull-up drive signal and the pull-down drive signal according to a code signal and output impedance-adjusted signals to an output terminal,
   wherein the data driving unit includes:
   an input unit configured to drive and latch a control signal according to the clock signal and a pulse control signal;
   a level shifter configured to level-shift the input signal according to the clock signal when the control signal is activated, and output the output signals according to the level-shifting result;
   a pulse generator configured to output the pulse control signal by combining the output signals; and
   a drive signal generator configured to pull up or down the pull-up drive signal and the pull-down drive signal according to the output signal.

2. The semiconductor device according to claim 1, wherein the number of data driving units is plural so that the plural data driving units output the pull-up drive signal through a single pull-up terminal and output the pull-down drive signal through a single pull-down terminal.

3. The semiconductor device according to claim 1, wherein the input unit includes:
   a pull-up drive element electrically coupled between a peri-voltage input terminal and an output terminal of the control signal, configured to be controlled by the clock signal;
   a pull-down drive element electrically coupled between an output terminal of the control signal and a ground voltage terminal, configured to be controlled by the pulse control signal; and
   a latch unit configured to latch the control signal.

4. The semiconductor device according to claim 1, wherein the level shifter is configured to level-shift the input signal from a peri-voltage level to a power-supply voltage level when the control signal is activated.

5. The semiconductor device according to claim 1, wherein the level shifter is configured to precharge an output node by the pulse control signal.

6. The semiconductor device according to claim 1, wherein the level shifter includes:
   a pull-up unit controlled by a signal of an output node, configured to pull the output node up to a power-supply voltage;
   a pull-down unit controlled by the input signal, configured to pull the output node down;
   an activation unit configured to provide a ground voltage to the pull-down unit upon receiving the clock signal and the pulse control signal; and
   an output unit configured to output the output signal by inverting the signal of the output node.

7. The semiconductor device according to claim 6, wherein the level shifter further includes:
   a precharge unit controlled by the pulse control signal to precharge the output node.

8. The semiconductor device according to claim 7, wherein an output terminal of the precharge unit is electrically coupled to a gate terminal of the pull-up unit.

9. The semiconductor device according to claim 1, wherein the data output unit includes:
   a drive signal input unit configured to delay the pull-up drive signal and the pull-down drive signal;
   an adjusting unit configured to control a slew rate of a signal received from the drive signal input unit according to the code signal;
   an output driving unit configured to perform pre-driving of an output signal of the adjusting unit;
   a pull-up main driving unit configured to pull the output terminal up according to an output signal of the output driving unit; and
   a pull-down main driving unit configured to pull the output terminal down according to an output signal of the output driving unit.

10. The semiconductor device according to claim 9, wherein the adjusting unit includes:
    a first adjusting unit electrically coupled to an output terminal of a first drive signal input unit, configured to adjust a slew rate of the pull-up drive signal; and
    a second adjusting unit electrically coupled to an output terminal of a second drive signal input unit, configured to adjust a slew rate of the pull-down drive signal.

11. The semiconductor device according to claim 10, wherein the first adjusting unit includes:
    a first resistor electrically coupled to an output terminal of the first drive signal input unit;
    a first MOS capacitor electrically coupled to the first resistor;
    a first NAND gate configured to perform a logic NAND operation between an output signal of the first resistor and a first code signal;

a second NAND gate configured to perform a logic NAND operation between an output signal of the first drive signal input unit and a second code signal;

a third NAND gate configured to perform a logic NAND operation between an output signal of the first drive signal input unit and a third code signal;

a fourth NAND gate configured to perform a logic NAND operation between an output signal of the first resistor and a fourth code signal;

a second resistor electrically coupled to an output terminal of the first NAND gate; and a second MOS capacitor electrically coupled to the second resistor.

12. The semiconductor device according to claim 11, wherein the second adjusting unit includes:

a third resistor electrically coupled to an output terminal of the second drive signal input unit;

a third MOS capacitor electrically coupled to the third resistor;

a fifth NAND gate configured to perform a logic NAND operation between an output signal of the third resistor and a first code signal;

a sixth NAND gate configured to perform a logic NAND operation between an output signal of the second drive signal input unit and a second code signal;

a seventh NAND gate configured to perform a logic NAND operation between an output signal of the second drive signal input unit and a third code signal;

an eighth NAND gate configured to perform a logic NAND operation between an output signal of the second resistor and a fourth code signal;

a fourth resistor electrically coupled to an output terminal of the fifth NAND gate; and a fourth MOS capacitor electrically coupled to the fourth resistor.

13. The semiconductor device according to claim 9, wherein the output driving unit includes:

a plurality of pre-drivers configured to perform pre-driving of a pull-up terminal and a pull-down terminal according to the output signal of the adjusting unit.

14. The semiconductor device according to claim 1, wherein the code signal is generated by Off Chip Driver (OCD) calibration control.

15. A semiconductor device comprising:

a data driving unit configured to output a pull-up drive signal and a pull-down drive signal by driving data; and a data output unit configured to perform a termination of a data output line according to the pull-up drive signal and the pull-down drive signal and output a termination result to an output terminal, wherein the data driving unit includes:

an input unit configured to drive and latch a control signal according to a clock signal and a pulse control signal;

a level shifter configured to level-shift the input signal according to the clock signal when the control signal is activated, and output the output signals according to the level-shifting result;

a pulse generator configured to output the pulse control signal by combining the output signals; and a drive signal generator configured to pull up or down the pull-up drive signal and the pull-down drive signal according to the output signal.

16. The semiconductor device according to claim 15, further comprising:

adjusting units configured to adjust slew rates of drive signals and output adjusted signals.

17. The semiconductor device according to claim 15, further comprising:

output driving units configured perform pre-driving of output signals of the adjusting units.

18. A semiconductor device comprising:

a data driving unit including a plurality of drivers configured to drive data according to clock signals and output a pull-up drive signal and a pull-down drive signal; and a data output unit configured to output a drive signal by inverting the pull-up drive signal and the pull-down drive signal, wherein the data driving unit includes:

an input unit configured to drive and latch a control signal according to a clock signal and a pulse control signal;

a level shifter configured to level-shift the input signal according to the clock signal when the control signal is activated, and output the output signals according to the level-shifting result;

a pulse generator configured to output the pulse control signal by combining the output signals; and a drive signal generator configured to pull up or down the pull-up drive signal and the pull-down drive signal according to the output signal.

19. The semiconductor device according to claim 18, further comprising:

one or more adjusting units configured to adjust a slew rate of the drive signal.

* * * * *